US 6,594,309 B1

(12) United States Patent
Botti et al.

(10) Patent No.: US 6,594,309 B1
(45) Date of Patent: Jul. 15, 2003

(54) PWM POWER AMPLIFIER WITH DIGITAL INPUT

(75) Inventors: Edoardo Botti, Vigevano (IT); Antonio Grosso, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/497,843

(22) Filed: Feb. 3, 2000

(30) Foreign Application Priority Data

Feb. 11, 1999 (EP) .......................................... 99830073

(51) Int. Cl.⁷ ............................. H03K 7/08; H03F 3/38
(52) U.S. Cl. ......................................... 375/238; 336/10
(58) Field of Search ................................. 375/238, 242; 329/312; 332/109; 330/10, 251, 262; 341/126, 144

(56) References Cited

U.S. PATENT DOCUMENTS

| | | | |
|---|---|---|---|
| 4,673,887 A | | 6/1987 | Atherton ...................... 330/10 |
| 4,683,439 A | | 7/1987 | Atherton et al. ............... 330/10 |
| 4,739,304 A | * | 4/1988 | Takeda et al. ............... 341/156 |
| 5,406,284 A | | 4/1995 | Lin et al. .................... 341/144 |
| 5,959,501 A | * | 9/1999 | Chester ....................... 330/251 |
| 6,014,055 A | * | 1/2000 | Chester ....................... 330/10 |

FOREIGN PATENT DOCUMENTS

| | | |
|---|---|---|
| EP | 0 212 990 A2 | 8/1986 |
| EP | 0 383 689 A2 | 2/1990 |
| EP | 0 457 496 A2 | 5/1991 |

* cited by examiner

*Primary Examiner*—Don N. Vo
(74) *Attorney, Agent, or Firm*—Lisa K. Jorgenson; Allen, Dyer, Doppelt, Milbrath & Gilchrist, P.A.

(57) ABSTRACT

A digital input PWM power amplifier includes an oversampling and noise shaping circuit receiving pulse code modulated (PCM) digital input data organized in words of a first number of M bits at a bit rate, and outputting PCM digital data organized in words of a smaller number of N bits at a multiple bit rate. A first bus transmits a first number of most significant bits (MSB) of the N bit words output from the oversampling and noise shaping circuit, and a second bus transmits a second number of least significant bits (LSB) of the N bit words output from the oversampling and noise shaping circuit. First and second PCM/PWM converters are respectively fed with the first and second number of bits transmitted through the first and second buses. The PWM signal output by the first converter is summed to an attenuated PWM signal output by the second converter on the inverting input node of the output power stage.

28 Claims, 11 Drawing Sheets

PWM POWER AMPLIFIER WITH DIGITAL INPUT

FIELD OF THE INVENTION

The present invention relates to high efficiency low frequency amplifiers, commonly referred to as class-D amplifiers, and, more particularly, though not exclusively, to class-D audio amplifiers.

BACKGROUND OF THE INVENTION

The efforts of manufacturers for reducing energy consumption, weight and size of heat sinks of consumer apparatuses, such as in the field of car entertainment, have generated a demand for power amplifiers with a greater efficiency than the traditional class-AB amplifiers.

Class-D amplifiers have been proposed to respond to these requirements. These amplifiers include a DC to AC converter circuit, which produces a PWM output signal. This PWM output signal drives output power devices through a passive lowpass filter for reconstructing an amplified analog (audio) signal. For example, the reconstructed amplified analog (audio) signal drives a load, such as a speaker, that may be a part of the lowpass filter.

The analysis of the behavior of a single ended amplifier with an analog input and a PWM output, i.e, a class-D amplifier, is described in the paper titled "Analysis Of A Quality. Class-D Amplifier" by Himmelstoss et al., I.E.E.E. Transactions on Consumer Electronics, Vol. 42, No. 3, August 1996. However, the increasing interest in digital audio signal processing will make the use of digital amplifiers more convenient than analog amplifiers.

Presently, there are no known commercial applications of digital input amplifiers, and few articles describe possible design approaches. One such article is titled "Noise Shaping And Pulse-Width Modulation For All-Digital Audio Power Amplifiers" by Goldberg et al., Journal Audio Eng. Doc., Vol. 39, No. 6, June 1991. The described system does not use a feedback circuit on the final stage, which to some extent penalizes the performance in terms of distortion and noise rejection. The performance appears to be strictly dependent on the characteristics of the components of the power stage (FIG. 8).

Another article titled "All Digital Power Amplifier Based On Pulse Width Modulation" by Pedersen et al., was presented during the 96th Audio Engineering Society (AES) convention, Feb. 26–Mar. 1, 1994, in Amsterdam. According to this design approach there is no feedback circuit. The system appears to be burdened by resorting to a linearized PWM signal.

Yet another article titled "A Sigma-Delta Power Amplifier For Digital Input Signals" by Klugbauer-Heilmeier was presented during the 102nd AES convention Mar. 22–25, 1997, in Munich. This article describes a pulse density modulation (PDM) amplifier requiring a high switching frequency in addition to an anti-aliasing filter in the feedback path.

SUMMARY OF THE INVENTION

An object of the present invention is to provide a digital input PWM power amplifier functioning at a relatively low switching frequency to achieve a high efficiency.

Another object of the invention is that the PWM power amplifier is easy to make, and has a low sensitivity with respect to the spread of the actual parameter values of the circuit's components.

Yet another object of the invention is that the PWM amplifier operates at the. lowest possible driving frequency of the PCM/PWM converter without requiring. integrated lowpass filters. The only filter of the system is a lowpass filter connected in cascade to the PWM amplifier output, which is always present in switching output stages.

These objects and others are attained by a PWM power amplifier comprising an oversampling and noise shaping circuit receiving pulse code modulation (PCM) input digital data organized in words composed of a certain number (M) of bits, and outputting PCM digital data converted into words composed of a number (N) of bits lower than the number of bits of the input data (M>N) at a multiple bit rate (Fin*k) equal to the bit rate (Fin) of the input data.

A first bus transmits a first fraction (P) of most significant bits (MSB) of the words output from the oversampling and noise shaping circuit, and a second bus transmits the remaining (S) least significant bits (LSB) of the words output from the oversampling and noise shaping circuit.

The first and second PCM/PWM converters respectively receive data transmitted on the first and second buses. Each converter comprises a counter that is reset by the transitions of the digital value of data fed to the respective converter. The converter functions in an up/down mode and is fed with at least a clock signal (Fclock) whose frequency is equal to the multiplied bit rate (Fin*k) of the data transmitted on the respective buses of the converter. This data is multiplied by the base 2 raised to the relative number of bits (P or S) of the transmitted words.

Each converter generates reference digital words composed by the respective number of bits (P or S) representing incremental and decremental digital values. These values define single or multiple slope rising and descending ramps of digital values whose rate is identical to the bit rate of the data fed to the converter. A digital comparator receives through a first input the reference digital words generated by the up-down counter, and receives through a second input the input data, and outputs a PWM digital signal (MSBdig, LSBdig) at a switching frequency equal to the bit rate of the input digital data stream.

The PWM output signal (MSBdig) of the first converter that receives the fraction (P) of most significant bits is summed on the inverting input node (–) of a final power amplifying stage of the amplifier to the PWM output signal (LSBdig) of the second converter (LSBdig). This signal is attenuated by a ratio equivalent to the base 2 raised to the number (S) of bits transmitted through the second bus to the input of the second converter.

The pair of PCM/PWM converters may be of the single or multiple ramp type. The use of double ramp converters, i.e., with a succession of rising and falling ramps, enhances the amplifier performance in terms of distortion and of the signal-to-noise ratio as compared to a single ramp converter. The reference signal for a double ramp converter is substantially a triangular waveform. The reference signal for a single ramp converter is substantially a saw-tooth waveform.

The output signal produced by the single final power stage in the case of a single ended amplifier or of the two final power stages in the case of a bridge configuration, i.e., upstream of the lowpass analog signal reconstructing filter (s), is a PWM signal whose frequency is equal to the output signal (MSBdig) produced by the first converter but has a different duty-cycle as a function of the following parameters: supply voltage of the final power stage; nonlinearity and losses of the final power stage; and correction made to the signal (LSBdig) output by the second converter.

BRIEF DESCRIPTION OF THE DRAWINGS

The various aspects and advantages of the invention will become even more evident through the following description of several embodiments and by referring to the annexed drawings, wherein.

DETAILED DESCRIPTION OF THE PREFERRED EMBODIMENTS

Figure 1:
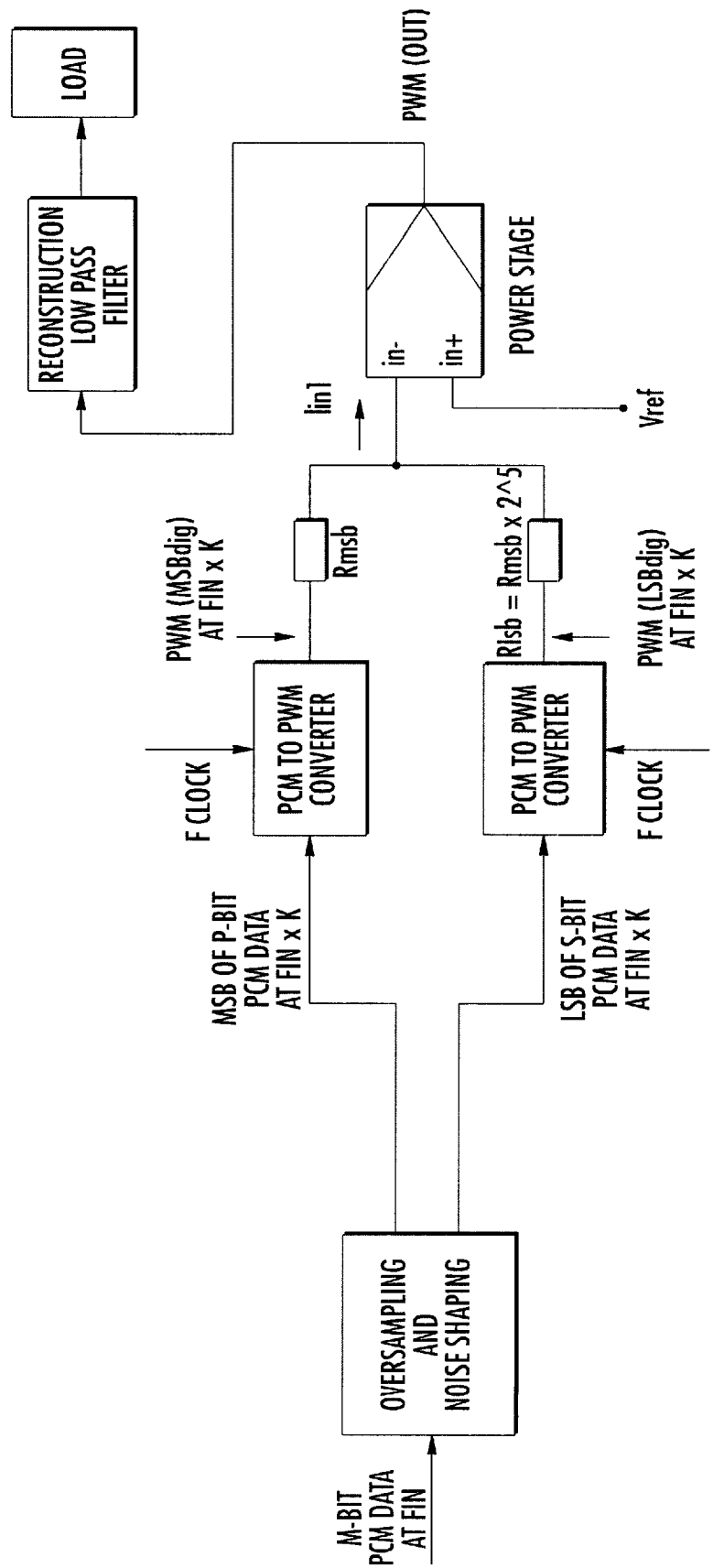
FIG. 1 is a block diagram of a first embodiment of the basic structure of the PWM power amplifier according to the present invention.

By referring to the basic scheme of FIG. 1, each digital M bit word of the digital input data stream has a bit rate of Fin. Each digital M bit word is converted by oversampling and noise shaping techniques into an N bit word of a lower number of bits than the input word (M>N), and with a multiple bit rate of Fin*k.

The N bits that compose the output words of the noise shaping and oversampling block are divided on two distinct buses. The first bus transmits a first fractional number P of most significant bits (MSB), while the second bus transmits the remaining number S of least significant bits (LSB). The most significant bits (MSB) are sent to a first PCM/PWM converter, whereas the S least significant bits (LSB) are sent to a second PCM/PWM converter.

The subdivision of the N bits into which the M bit PCM input digital data are reorganized permits the use of clock frequencies not excessively high when converting the PCM data to a PWM signal. Assuming a transformation into a PWM signal of a 16 bit PCM signal at 44.1 kHz without a detectable degradation of the signal-to-noise ratio, it would be necessary to use a sampling clock of $44,100*2^{16}=2.8$ GHz, which is substantially beyond the possibilities of implementation in present integrated circuits.

Another problem that is overcome by the subdivision is that the switching frequency of the output PWM signal would be too close to the maximum frequency to be played back. For the example considered, this value is 44.1 kHz. The maximum frequency is generally about 20 kHz in an audio system. This causes problems with harmonic distortion, with linearity and with signal residues with the PWM switching frequency downstream of the reconstructing lowpass filter.

Considering that the switching frequencies of PWM amplifiers are commonly between 100 Hz and 500 kHz, and assuming a switching frequency of the PWM signal sufficiently far from the audio band, for example, about $44,100*8=352.8$ kHz, with a number P of MSB equal to 6 and the number S of LSB equal to 6, the clock frequency required by the PCM/PWM converters is $352,800*2^6=22.57$ MHZ. This frequency may easily be handled with present fabrication techniques of integrated circuits.

Figure 2:
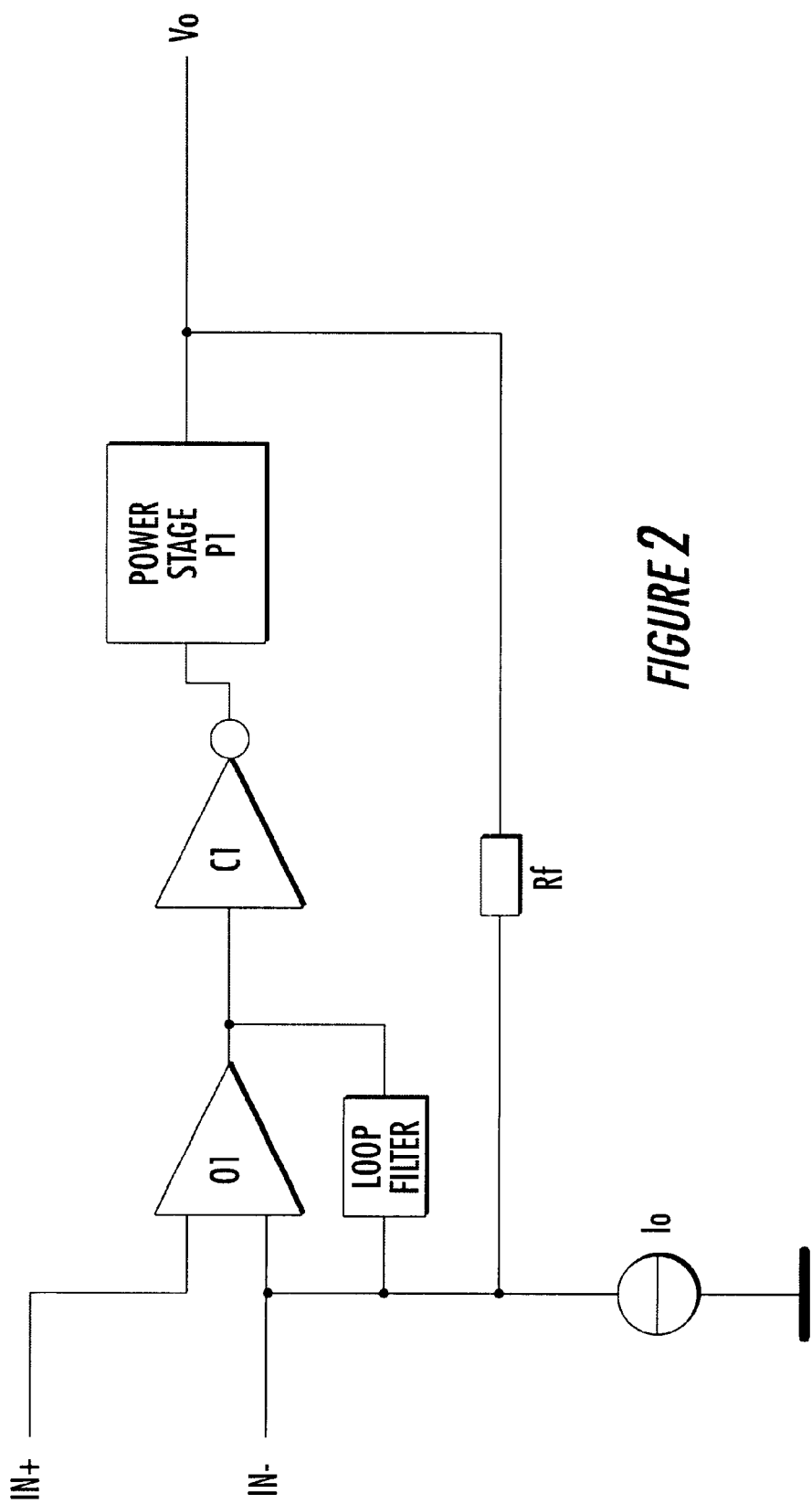
FIG. 2 shows the internal structure of the final power stage illustrated in FIG. 1.

FIG. 2 shows the internal structure that may be used to realize the final power amplifying block. This class-D power amplifying module is described and illustrated in the European Patent Application No. 98,830,685.8, filed on Nov. 13, 1998, in the name of the current assignee of the present invention. The circuit does not require the generation of a reference triangular wave or any self-oscillating structures, thus making it usable also for analog inputs. Different inputs may be selected by a dedicated input configuration network, which is not shown in the figure since it would be irrelevant in the present context.

Figure 3:
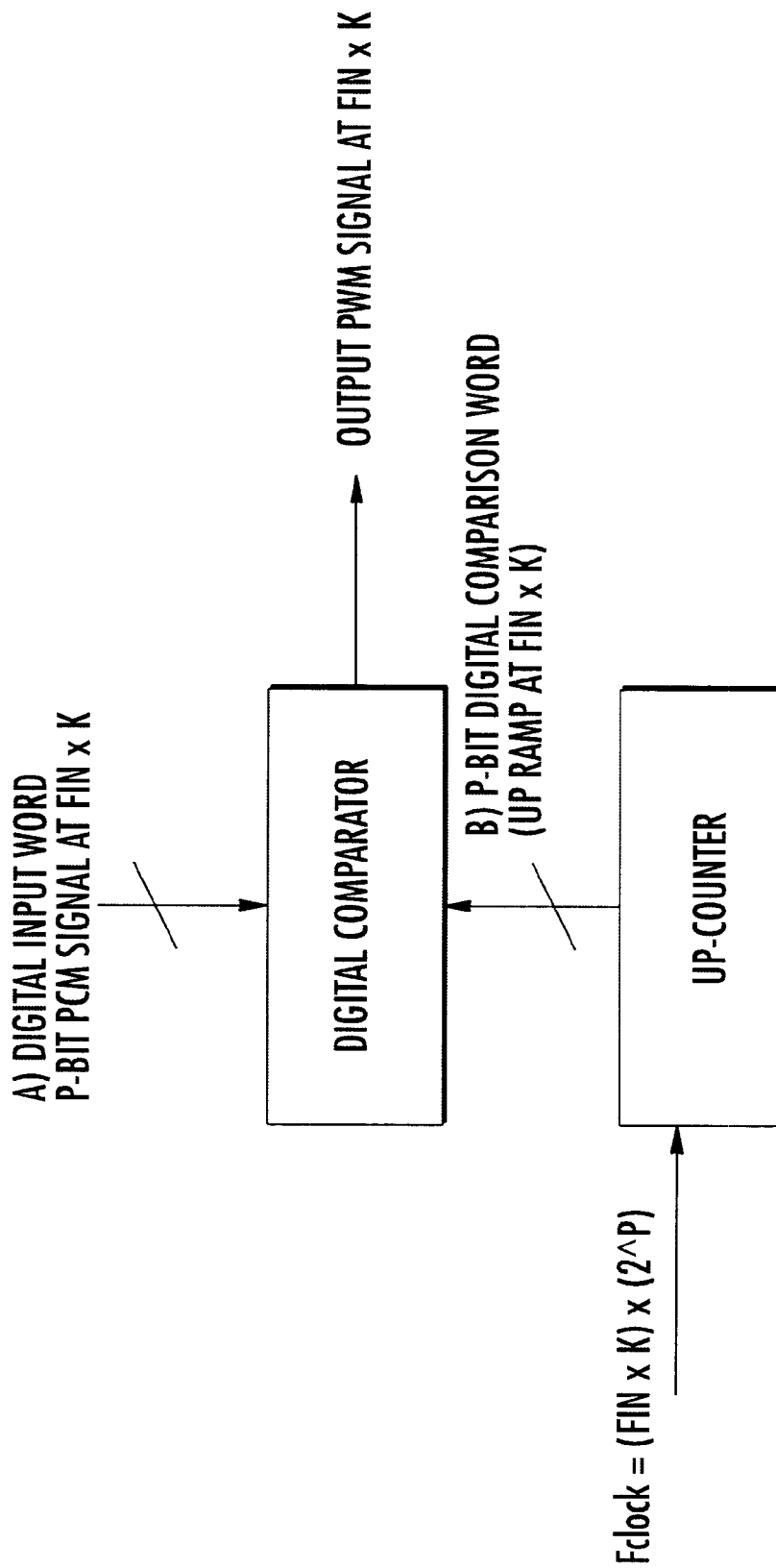
FIG. 3 shows the internal structure of each of the two PCM/PWM converters illustrated in FIG. 1 with respect to a single ramp embodiment.
Figure 4:
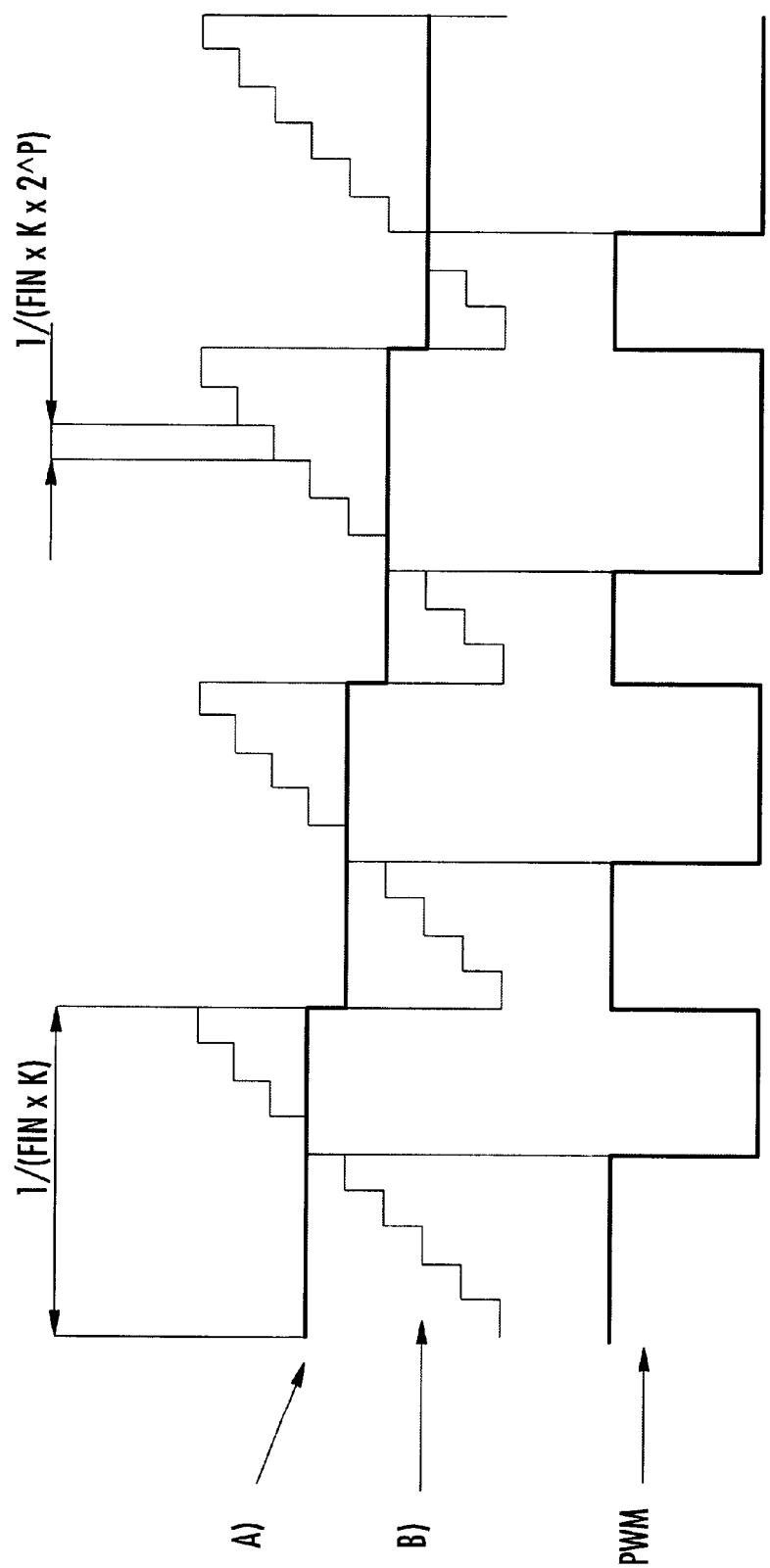
FIG. 4 shows the operation waveforms of the PCM/PWM single ramp converter illustrated in FIG. 3.

FIGS. 3 and 4 show respectively the functional block diagram and the operation functioning waveforms of each PCM/PWM converter used in the amplifier scheme of FIG. 1. The signal indications are those of the first of the two converters fed through the P bit (MSB) bus. According to this embodiment, both converters are of single ramp type. The ramp is generated by a periodic and resettable up-counter, fed with a clock signal Fclock of a frequency equal to the product of the bit rate of the data transmitted on the respective bus and the base 2 raised to the number of bits in which the fed data are organized. The signal output from each of the two PCM/PWM converters is a PWM signal, whose duty cycle depends on the MSB or LSB input data.

By referring to the complete diagram of FIG. 1, the pair of PWM signals obtained from the separate conversion of the two portions of bits, respectively MSBdig and LSBdig, are eventually added on the inverting input node (−) of the final power amplifying module. This is after the LSBdig PWM signal is attenuated by a factor equivalent to a ratio equivalent to the base 2 raised to the number S of bits input through the second bus to the second converter.

In this way, the main PWM signal MSBdig, generated or produced by the first PCM/PWM converter, drives the output stage for determining a switching frequency equal to Fin*K. The attenuated PWM signal LSBdig generated by the second converter PCM/PWM drives the output stage with a weight reduced by $\frac{1}{2}^S$. This does not affect the switching frequency of the output power stage, but modulates the output PWM signal compensating for nonlinearities and attenuating the noise introduced by the quantization of a reduced number P of bits of the main PWM signal MSBdig.

Figure 5:
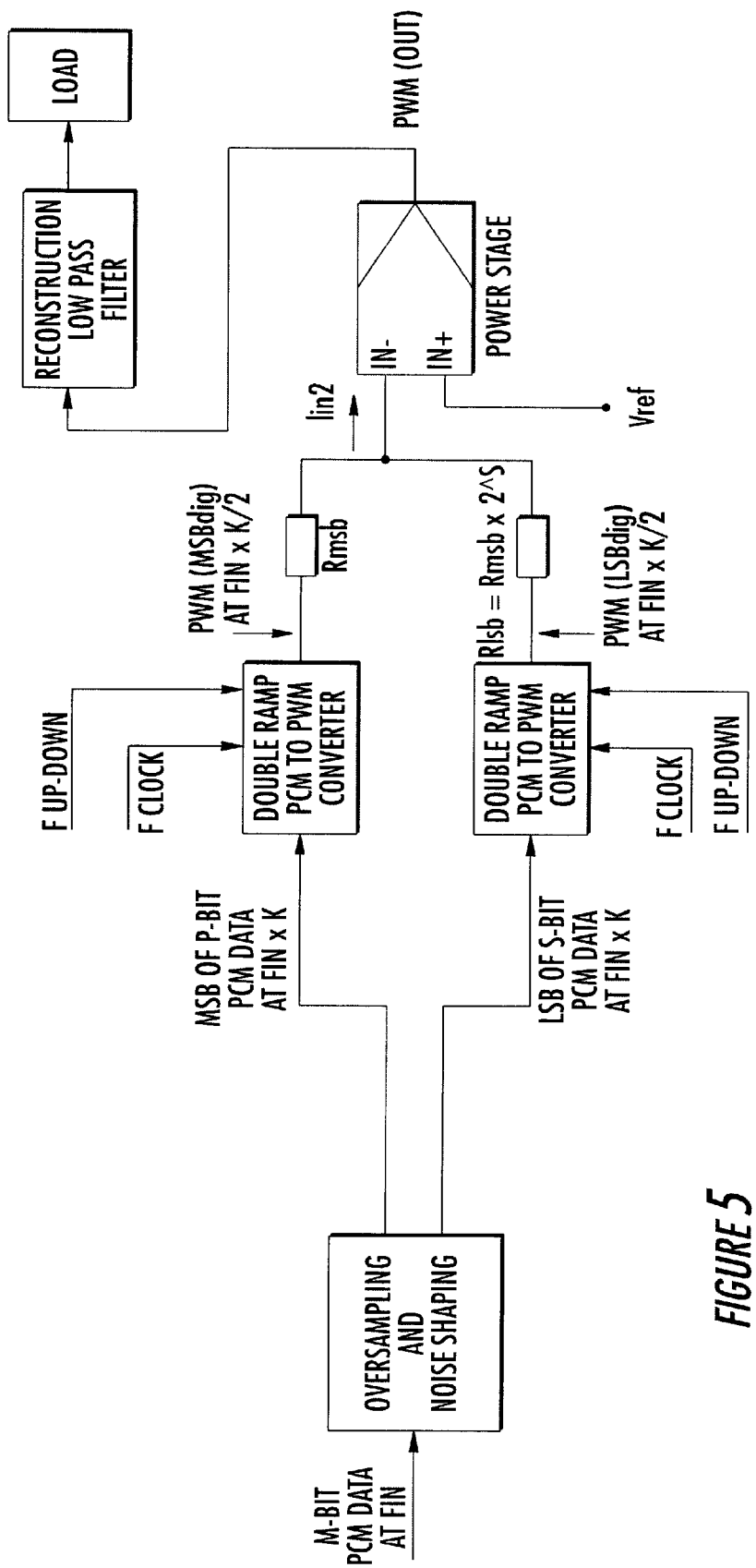
FIG. 5 is a block diagram of an alternative embodiment of the basic structure of the PWM power amplifier relative to the use of double ramp PCM/PWM converters according to the present invention.

An alternative embodiment of the amplifier of the invention is shown in FIG. 5. According to this embodiment, the use of double ramp PCM/PWM converters determines a frequency of their respective PWM output signals halved with respect to the bit rate of the input PCM data.

Figure 6:
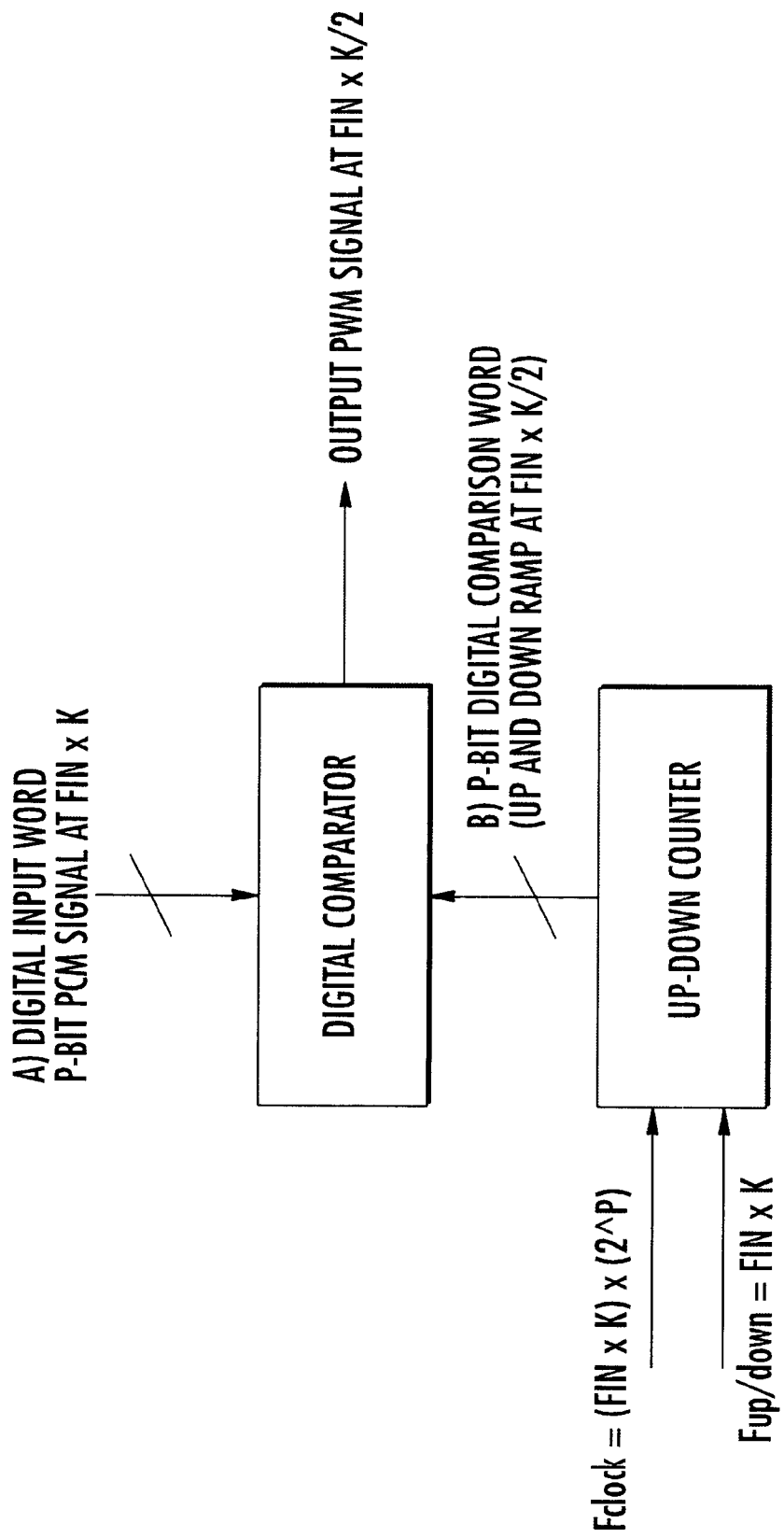
FIG. 6 shows the internal structure of the PCM/PWM double ramp converter illustrated in FIG. 5.
Figure 7:
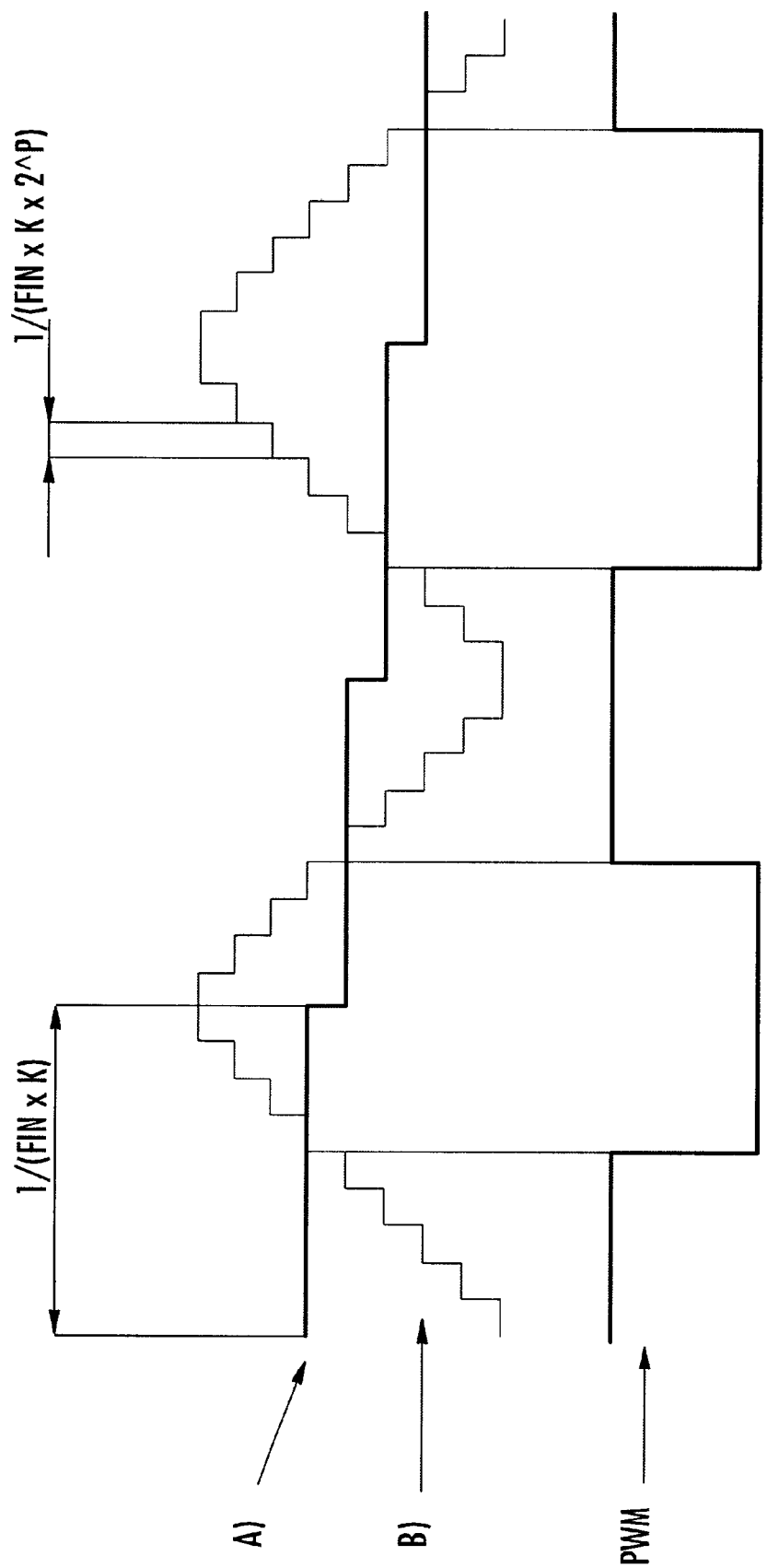
FIG. 7 shows the operation waveforms of the double ramp PCM/PWM converter illustrated in FIG. 6.

FIGS. 6 and 7 show respectively the functional block diagram of the two PCM/PWM double ramp converters and the relative operation waveforms. The indications refer to the first of the two converters fed through the P bit bus (MSB). FIG. 6 shows the feeding of a second clock signal Fup/down with the same multiplied frequency Fin*K of the data input to the converter that synchronizes the ramp inversions.

The amplifier of the invention may also be realized in the form of a bridge amplifier by using two final power amplifying stages driven in phase opposition rather than in a single ended form. By way of example, FIG. 8 shows the diagram of a bridge version of the amplifier, wherein the required inversion is implemented by inverting the data input to the second final stage of the power amplifier.

Figure 8:
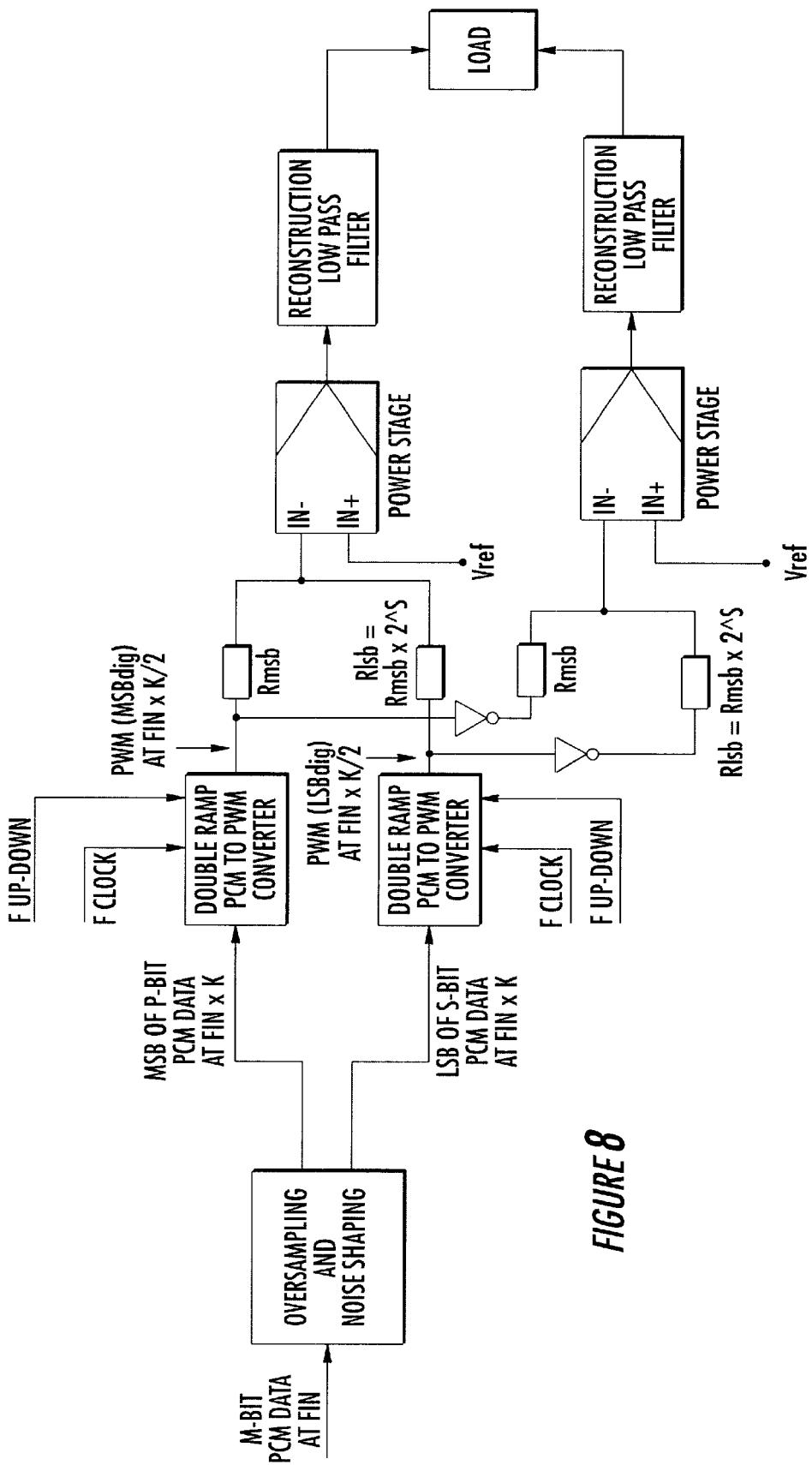
FIGS. 8, 9, 10 and 11 respectively show different embodiments of a bridge amplifier according to the present invention.
Figure 9:
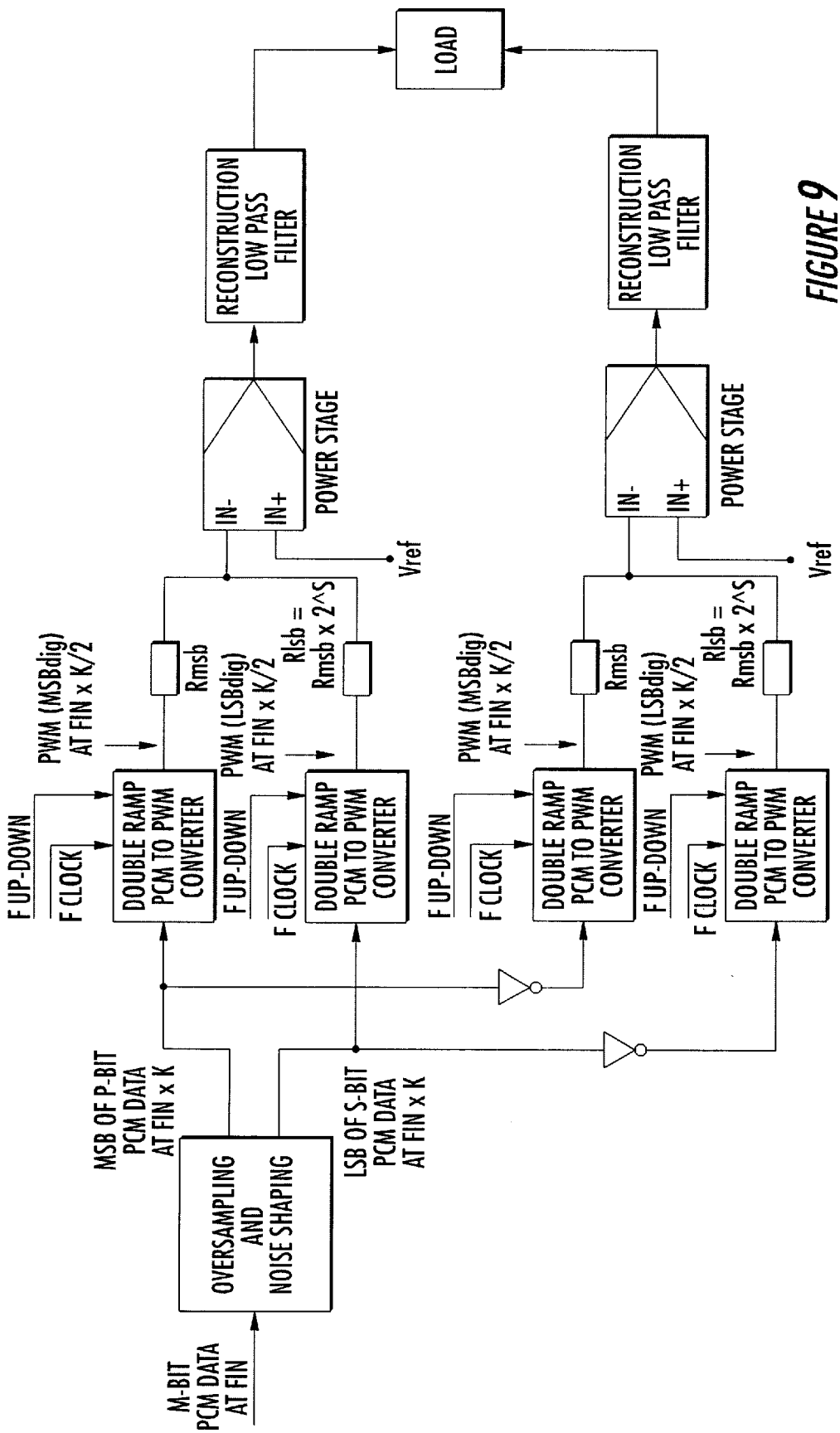

FIG. 9 shows an alternative embodiment of a bridge amplifier of the invention with a phase shift bridge output architecture, which is relatively more complex than that of FIG. 8. Even though the bridge amplifier in FIG. 9 is more complex, it is capable of providing for enhanced performances as described and illustrated in the above referenced European Patent Application No. 98,830,685.8.

Figure 10:
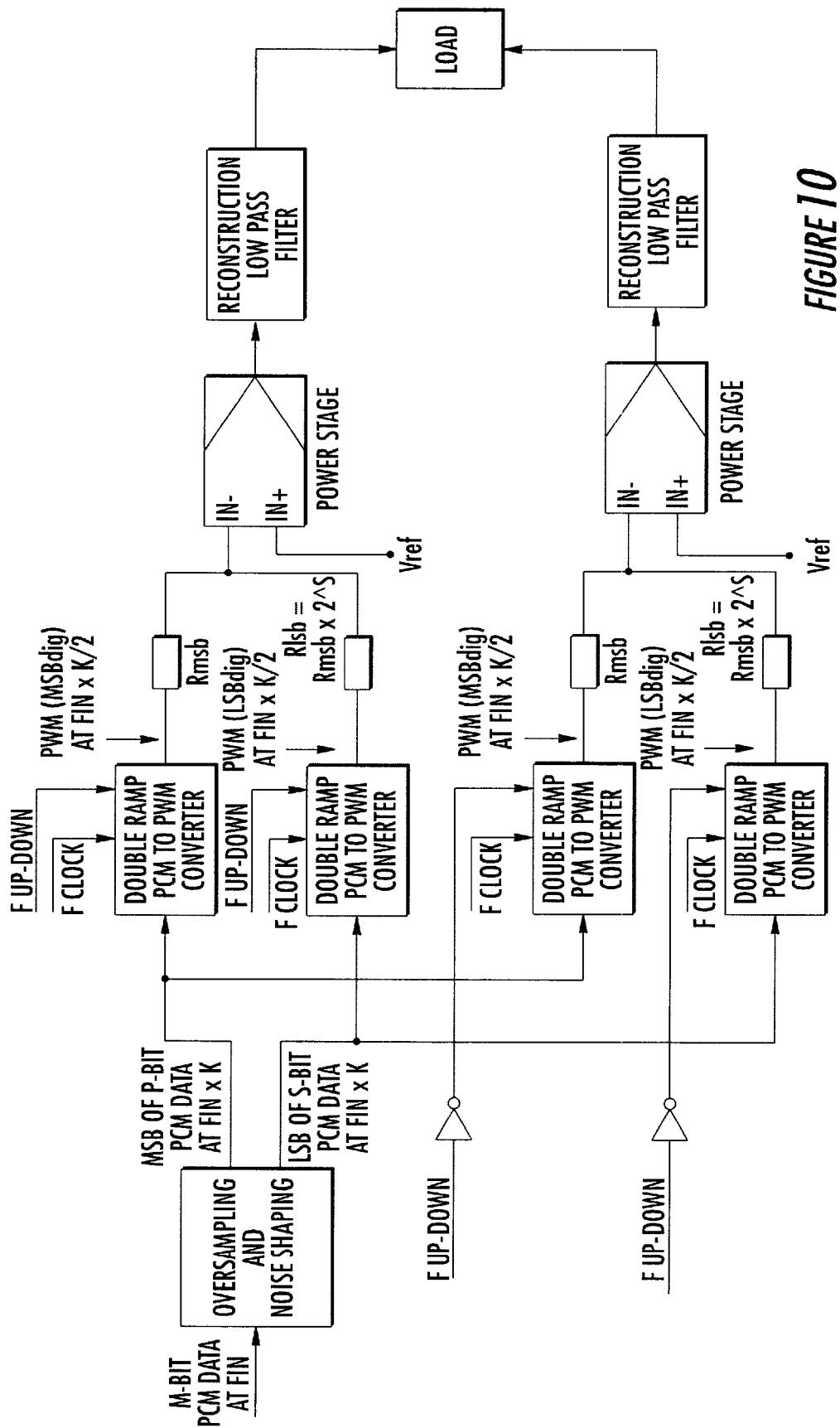

FIG. 10 shows a further embodiment of a bridge amplifier of the invention in which, rather than inverting the data fed to the input of one of the pair of final power stages functioning in phase opposition, the inversion is implemented by inverting the up-down command of the respective counters of the second pair of PCM/PWM converters. This is done to generate triangular reference signals in phase opposition with each other.

Figure 11:
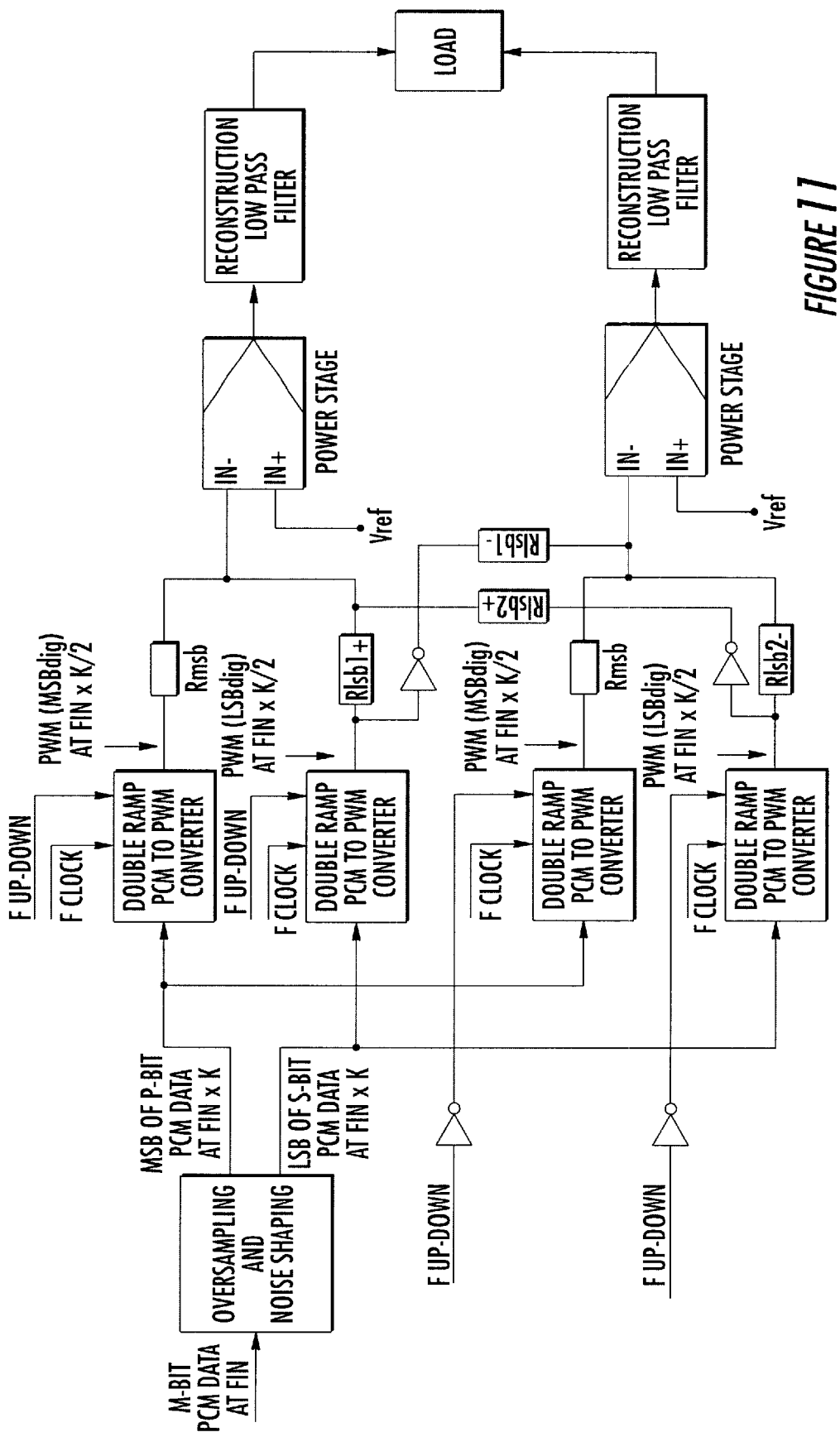

A fourth embodiment of the bridge amplifier of the invention is illustrated in FIG. 11. According to this embodiment, the PWM signals of double frequency compared to the frequency of the main PWM signal relative to the conversion of the least significant bits are summed to the respective main PWM signals. These signals are produced by the respective PCM/PWM converters fed with the most significant bits on the respective inverting input nodes of the two final power stages.

Another characteristic of the correction provided by the separate conversion of the least significant bits is a greater freedom because the correction current may be summed, subtracted or may not influence the main drive current signal relative to the conversion of most significant bits.

An advantage of a bridge embodiment of the amplifier of the invention is that the correction signal does not contain tones at the PWM switching frequency, nor at frequencies near the switching frequency. Notably, tones in a ±20 kHz band centered on the switching frequency are feed back in the base band causing an increase in the distortion and/or noise.

In all the embodiments shown in the figures, the use of simple resistors are indicated for coupling PWM signals to the inverting input of the final power stage or stages (RMSB, RLSB, . . . ). However, as it will be evident to those-skilled in the art, these coupling resistors may be substituted by current generators driven by the logic signal output by the respective PCM/PWM converters.

That which is claimed is:

1. A digital input PWM power amplifier comprising:

an oversampling and noise shaping circuit receiving pulse code modulated (PCM) digital input data organized in words of a first number of M bits at a bit rate, and outputting PCM digital data organized in words of a smaller number of N bits at a multiple of the bit rate;

a first bus transmitting a first number of most significant bits (MSBs) of the N bit words output from said oversampling and noise shaping circuit, and a second bus transmitting a second number of least significant bits (LSBs) of the N bit words output from said oversampling and noise shaping circuit;

first and second PCM/PWM converters respectively fed from said first and second buses, each PCM/PWM converter comprising a counter driven by a clock signal having a frequency equal to the product of the bit rate of the MSBs or LSBs transmitted on the respective buses times the base two raised to the respective first or second number of MSBs and LSBs for generating reference digital words and defining ramps of digital values with a frequency equal to a frequency of the multiple of the bit rate, and a digital comparator receiving through a first input the reference digital words and through a second input the respective first or second number of MSBs and LSBs, and outputting a respective PWM signal; and an output power stage having an inverting input receiving a driving signal defined by a PWM signal output by said first PCM/PWM converter summed with an attenuated PWM signal output by said second PCM/PWM converter.

2. A PWM power amplifier according to claim 1, wherein each of said first and second PCM/PWM converters comprises a single ramp converter.

3. A PWM power amplifier according to claim 1, wherein each of said first and second PCM/PWM converters comprises a double ramp converter; and each of said counters comprises an up/down counter for generating reference digital words in a form of rising and falling ramps in succession at half a frequency of the multiple of the bit rate.

4. A PWM power amplifier according to claim 1, wherein said output power stage comprises a single output power stage which is single ended.

5. A PWM power amplifier according to claim 1, wherein said output power stage comprises a pair of output power stages functioning in phase opposition in which an inversion of the driving signal to an inverting input of one of said pair of power stages is formed by inverting the PWM signals output by said first and second PCM/PWM converters.

6. A PWM power amplifier according to claim 1, wherein each of said first and second PCM/PWM converters comprises a pair of PCM/PWM converter circuits respectively connected to said first and second buses, and one of said pair of PCM/PWM converter circuits respectively receives an inversion of the first or second number of MSBs and LSBs transmitted through said first and second buses; and wherein said output power stage comprises a pair of output power stages functioning in phase opposition and in which an inversion of the driving signal of one of said pair of output power stages is formed by the pair of PCM/PWM converter circuits receiving the inversion of the first and second number of MSBs and LSBs transmitted by said first and second buses.

7. A PWM power amplifier according to claim 1, wherein each of said first and second PCM/PWM converters comprises a pair of PCM/PWM converter circuits respectively connected to said first and second buses, and one of said pair of PCM/PWM converter circuits receives inverted ramp inversion commands; and wherein said output power stage comprises a pair of output power stages functioning in phase opposition such that one of said output power stages is connected to the pair of PCM/PWM converter circuits receiving the inverted ramp inversion commands.

8. A PWM power amplifier according to claim 7, further comprising:

an invertor for inverting the respective PWM signals output by said PCM/PWM converter circuits receiving the LSBs;

an attenuator for attenuating the inverted PWM signals; and an adder circuit to respectively sum the attenuated inverted PWM signals with the driving signal produced by said pair of PCM/PWM converter circuits not providing the inverted PWM signals to be summed therewith.

9. A digital input PWM power amplifier comprising:
an input circuit receiving pulse code modulated (PCM) digital input data organized in words of a first number of M bits at a bit rate, and outputting PCM digital data organized in words of a smaller number of N bits at a multiple of the bit rate;
a first bus transmitting a first number of most significant bits (MSBs) of the N bit words output from said input circuit, and a second bus transmitting a second number of least significant bits (LSBs) of the N bit words output from said input circuit;
first and second converters respectively fed from said first and second buses, each converter comprising
a counter driven by a clock signal having a frequency equal to the product of the bit rate of the MSBs or LSBs transmitted on the respective buses times the base two raised to the respective first or second number of MSBs and LSBs, and
a digital comparator receiving through a first input the reference digital words and through a second input the respective first or second number of MSBs and LSBs, and outputting a respective PWM signal; and
an output power stage having an input receiving a driving signal defined by a PWM signal output by said first converter summed with an attenuated PWM signal output by said second converter.

10. A PWM power amplifier according to claim 9, wherein said input circuit comprises an oversampling and noise shaping circuit.

11. A PWM power amplifier according to claim 9, wherein each converter comprises a PCM/PWM converter.

12. A PWM power amplifier according to claim 9, wherein each converter defines ramps of digital values with a frequency equal to a frequency of the multiple of the bit rate.

13. A PWM power amplifier according to claim 9, wherein the input of said output power stage receiving the driving signal is an inverted input.

14. A PWM power amplifier according to claim 9, wherein each of said first and second PCM/PWM converters comprises a single ramp converter.

15. A PWM power amplifier according to claim 9, wherein each of said first and second converters comprises a double ramp converter; and each of said counters comprises an up/down counter for generating reference digital words in a form of rising and falling ramps in succession at half a frequency of the multiple of the bit rate.

16. A PWM power amplifier according to claim 9, wherein said output power stage comprises a single output power stage which is single ended.

17. A PWM power amplifier according to claim 9, wherein said output power stage comprises a pair of output power stages functioning in phase opposition in which an inversion of the driving signal to an inverting input of one of said pair of power stages is formed by inverting the PWM signals output by said first and second converters.

18. A PWM power amplifier according to claim 9, wherein each of said first and second converters comprises a pair of converter circuits respectively connected to said first and second buses, and one of said pair of converter circuits respectively receives an inversion of the first or second number of MSBs and LSBs transmitted through said first and second buses; and wherein said output power stage comprises a pair of output power stages functioning in phase opposition and in which an inversion of the driving signal of one of said pair of output power stages is formed by the pair of converter circuits receiving the inversion of the first and second number of MSBs and LSBs transmitted by said first and second buses.

19. A PWM power amplifier according to claim 9, wherein each of said first and second converters comprises a pair of converter circuits respectively connected to said first and second buses, and one of said pair of converter circuits receives inverted ramp inversion commands; and wherein said output power stage comprises a pair of output power stages functioning in phase opposition such that one of said output power stages is connected to the pair of converter circuits receiving the inverted ramp inversion commands.

20. A PWM power amplifier according to claim 19, further comprising:
an invertor for inverting the respective PWM signals output by said converter circuits receiving the LSBs;
an attenuator for attenuating the inverted PWM signals; and
an adder circuit to respectively sum the attenuated inverted PWM signals with the driving signal produced by said pair of converter circuits not providing the inverted PWM signals to be summed therewith.

21. A method for converting a PCM signal to a PWM signal for a PWM power amplifier comprising the steps of:
dividing the PCM signal comprising words of a first number of M bits at a bit rate into words of a smaller number of N bits at a multiple of the bit rate;
transmitting a first number of most significant bits (MSBs) of the N bit words on a first bus, and transmitting a second number of least significant bits (LSBs) of the N bit words on a second bus;
driving a pair of counters by respective clock signals having a frequency equal to the product of the bit rate of the MSBs or LSBs transmitted on the respective buses times the base two raised to the respective first and second number of bits for generating reference digital words; and
generating a driving signal based upon the pair of counter.

22. A method according to claim 21, wherein the step of generating comprises:
comparing the respective reference digital words with the respective first and second number of bits for outputting a respective PWM signal; and
summing a PWM signal with an attenuated PWM signal output defining the driving signal.

23. A method according to claim 21, wherein the step of driving the pair of counters comprises respectively defining ramps of digital values with a frequency equal to a frequency of the multiple of the bit rate.

24. A method according to claim 23, wherein the ramps are single ramps.

25. A method according to claim 21, wherein the driving signal is applied to an output power stage of the PWM power amplifier.

26. A method according to claim 24, wherein the ramps are double ramps; and the pair of counters comprise up/down counters for generating reference digital words in a form of rising and falling ramps in succession at half a frequency of the multiple of the bit rate.

27. A method according to claim 21, wherein the driving signal is applied to a pair of output power stages of the PWM power amplifier, the pair of output power stages functioning in phase opposition in which an inversion of the driving signal applied to an inverting input of one of the pair of power stages is formed by inverting the respective PWM signals.

28. A method according to claim 21, wherein each counter comprises a pair of counter circuits respectively connected to the first and second buses, and one of the pair of counters receives an inversion of the first and second number of bits transmitted through the first and second buses; and wherein the driving signal is applied to a pair of output power stages of the PWM power amplifier, the pair of output power stages functioning in phase opposition and in which an inversion of the driving signal of one of the pair of output power stages is formed by the counter circuits receiving the inversion of the first and second number of MSBs and LSBs bits transmitted through the first and second buses.

* * * * *